United States Patent
Hanson et al.

(10) Patent No.: US 10,578,656 B2
(45) Date of Patent: Mar. 3, 2020

(54) METHOD AND APPARATUS FOR MONITORING ENERGY CONSUMPTION

(71) Applicant: Ambiq Micro, Inc., Austin, TX (US)

(72) Inventors: Scott Hanson, Austin, TX (US); Stephen James Sheafor, Boulder, CO (US); David Cureton Baker, Austin, TX (US)

(73) Assignee: Ambiq Micro, Inc., Austin, TX (US)

( * ) Notice: Subject to any disclaimer, the term of this patent is extended or adjusted under 35 U.S.C. 154(b) by 0 days.

(21) Appl. No.: 14/918,437

(22) Filed: Oct. 20, 2015

(65) Prior Publication Data

US 2016/0109494 A1  Apr. 21, 2016

Related U.S. Application Data

(60) Provisional application No. 62/066,218, filed on Oct. 20, 2014.

(51) Int. Cl.
*G01R 21/127* (2006.01)
*G01R 21/133* (2006.01)

(52) U.S. Cl.
CPC .......... *G01R 21/127* (2013.01); *G01R 21/133* (2013.01)

(58) Field of Classification Search
None
See application file for complete search history.

(56) References Cited

U.S. PATENT DOCUMENTS

| | | | | |
|---|---|---|---|---|
| 3,634,663 A * | 1/1972 | Williams | ............... | G01R 21/08 324/103 R |
| 4,291,377 A * | 9/1981 | Schneider | ............ | G01R 21/133 324/142 |
| 4,405,987 A * | 9/1983 | Spalti | ................... | G01R 11/63 324/103 R |
| 4,902,965 A * | 2/1990 | Bodrug | .............. | G01R 21/1331 324/116 |
| 4,999,572 A * | 3/1991 | Bickford | ................ | G01R 35/04 250/233 |
| 5,006,782 A | 4/1991 | Pelly | | |
| 6,147,936 A * | 11/2000 | Nakajima | .......... | G01R 31/3648 368/204 |
| 7,548,125 B2 | 6/2009 | Carichner et al. | | |
| 8,316,245 B1 * | 11/2012 | Isik | .......................... | H03L 3/00 327/142 |
| 2006/0114642 A1 * | 6/2006 | Liu | .......................... | C25B 1/04 361/500 |
| 2007/0152734 A1 * | 7/2007 | Senthinathan | ......... | G11C 5/147 327/530 |
| 2008/0307240 A1 * | 12/2008 | Dahan | ..................... | G06F 1/06 713/320 |

(Continued)

FOREIGN PATENT DOCUMENTS

CN  100535951 C  *  9/2009
KR  101270073 B1  *  5/2013

*Primary Examiner* — Paresh Patel
(74) *Attorney, Agent, or Firm* — Hunt Pennington Kumar & Dula, PLLC; Artie Pennington

(57) ABSTRACT

An energy consumption monitor for use in an electronic system comprising an integrated circuit such as a microcontroller. The monitor comprises a counter adapted to accumulate pulses developed by a charge source, each pulse indicative of the delivery of one unit of charge to a load circuit. A monitoring facility monitors the counter to develop an energy consumption record over time.

8 Claims, 3 Drawing Sheets

(56) References Cited

U.S. PATENT DOCUMENTS

| | | | |
|---|---|---|---|
| 2009/0134314 A1* | 5/2009 | Youfa | H03K 17/04123 250/214 R |
| 2010/0033095 A1* | 2/2010 | Sadwick | H05B 33/0809 315/51 |
| 2016/0048197 A1* | 2/2016 | Hanssen | G06F 1/3293 713/323 |

* cited by examiner

METHOD AND APPARATUS FOR MONITORING ENERGY CONSUMPTION

CROSS REFERENCE TO RELATED APPLICATIONS

This application is related to the following:
1. Provisional Application Ser. No. 62/066,218, filed 20 Oct. 2014 ("Parent Provisional");
2. PCT Application No. PCT/US15/50239 filed 15 Sep. 2015 ("Related Application 1");
3. U.S. application Ser. No. 14/855,105, filed 15 Sep. 2015 ("Related Application 2");
4. U.S. application Ser. No. 14/918,348, filed 20 Oct. 2015 ("Related Application 3");
5. U.S. application Ser. No. 14/918,397, filed 20 Oct. 2015 ("Related Application 4"); and
6. U.S. application Ser. No. 14/918,406, filed 20 Oct. 2015 ("Related Application 5").

This application claims priority to the Parent Provisional, and hereby claims benefit of the filing date thereof pursuant to 37 CFR § 1.78(a)(4).

The subject matter of the Parent Provisional and the Related Applications, each in its entirety, is expressly incorporated herein by reference.

BACKGROUND OF THE INVENTION

1. Field of the Invention

Non-volatile semiconductor memory systems having multiple power states are described. More specifically, components and methods for improving utilization and reducing power requirements of flash memory systems that include sub- or near-threshold components are described.

2. Description of the Related Art

In general, in the descriptions that follow, the first occurrence of each special term of art that should be familiar to those skilled in the art of integrated circuits ("ICs") and systems will be italicized. In addition, when a term that may be new or that may be used in a context that may be new, that term will be set forth in bold and at least one appropriate definition for that term will be provided. In addition, throughout this description, the terms assert and negate may be used when referring to the rendering of a signal, signal flag, status bit, or similar apparatus into its logically true or logically false state, respectively, and the term toggle to indicate the logical inversion of a signal from one logical state to the other. Alternatively, the mutually exclusive boolean states may be referred to as logic_0 and logic_1. Of course, as is well known, consistent system operation can be obtained by reversing the logic sense of all such signals, such that signals described herein as logically true become logically false and vice versa. Furthermore, it is of no relevance in such systems which specific voltage levels are selected to represent each of the logic states.

Hereinafter, reference to a facility shall mean a circuit or an associated set of circuits adapted to perform a particular function regardless of the physical layout of an embodiment thereof. Thus, the electronic elements comprising a given facility may be instantiated in the form of a hard macro adapted to be placed as a physically contiguous module, or in the form of a soft macro the elements of which may be distributed in any appropriate way that meets speed path requirements. In general, electronic systems comprise many different types of facilities, each adapted to perform specific functions in accordance with the intended capabilities of each system. Depending on the intended system application, the several facilities comprising the hardware platform may be integrated onto a single IC, or distributed across multiple ICs. Depending on cost and other known considerations, the electronic components, including the facility-instantiating IC(s), may be embodied in one or more single- or multi-chip packages. However, unless expressly stated to the contrary, the form of instantiation of any facility shall be considered as being purely a matter of design choice.

Non-volatile solid-state memory systems are widely used in a variety of mobile and handheld devices, notably smart phones, tablets, laptops, and other consumer electronics products. Solid state memory, which can include embedded or stand-alone charge-based flash memory, phase change memory, resistive RAM ("RRAM"), or magneto-resistive memory ("MRAM"), is of particular advantage for battery operated mobile devices that have limited available power. Typically, electronic systems in such devices have processors, microcontrollers ("MCUs"), or other electronic controllers that support architected power states (e.g., an active state, a stand-by or sleep state, a deep sleep state, etc.). As compared to active states, the power consumption in these electronic systems can be significantly reduced when the device is maintained in stand-by or sleep states.

Shown in FIG. 1 is a typical general purpose computer system 10. Although not all of the electronic components illustrated in FIG. 1 may be operable in the sub-threshold or near-threshold domains in any particular embodiment, some, at least, may be advantageously adapted to do so, with concomitant reductions in system power dissipation. In particular, in recently-developed battery-powered mobile systems, such as smart-phones and the like, many of the discrete components typical of desktop or laptop devices illustrated in FIG. 1 are integrated into a single integrated circuit ("IC") chip. The Parent Provisional and Related Applications discloses several circuits adapted to operate in the sub-threshold domain.

Shown in FIG. 2 is a typical integrated system 12 comprising, inter alia, reference voltage ("$V_{Ref}$") generator 14, reference current ("$I_{Ref}$") generator 16, several digital modules, and several analog modules. An example of an analog module is analog to digital converter ("ADC") 18. Reference voltage generator 14 and reference current generator 16 are each common modules for supplying a stable reference to such analog modules. Reference voltage generator 14 is sometimes used to derive the output reference current provided by reference current generator 16. Also, reference voltage generator 14 and reference current generator 6 may be used to supply a stable reference to modules throughout integrated system 12.

For convenience of reference, in the system illustrated in FIG. 2, one instantiation of the voltage converter 20 is illustrated. In general, the voltage converter 20 is adapted to deliver to a load, e.g., any of the several components comprising system 12, a regulated voltage having a selected one of a first current capability and a second current capability substantially less than the first current capability. In one embodiment of voltage converter 20, at least one of the first and second voltages is dynamically adjusted as a function complementary to absolute temperature.

Shown in greater detail in FIG. 3 is one embodiment of the adaptive voltage converter 20. A battery 22 supplies a voltage, $V_{Bat}$, to converter 20, which generates a lower regulated voltage, $V_{Reg}$, that may be delivered to a load circuit 24, which can be a circuit of any type. The voltage $V_{Reg}$ may be sub-threshold, near-threshold or super-threshold. In general, the converter 20 may comprise two or more voltage converters/regulators 26, of which only two are illustrated in FIG. 3. A multiplexing circuit 28 selects between the outputs of the several converters/regulators 26 depending on the state of a control signal 30 generated by a control facility 32. Control 32 also selectively enables and/or disables each of the converters/regulators 26; and a voltage reference $V_{Ref}$ generator 34. In addition to basic voltage regulation, the converter 20 may be adapted to change the output of each converter/regulator 26 based on a number of variables, including, for example, process corner, temperature and input voltage. Details of important elements and variants of the adaptive voltage converter 20, as well as a specific implementation, are disclosed in Related Application 1.

As disclosed in Related Application 1, the embodiment illustrated in FIG. 3, converter 20 comprises two converters: a buck converter 26a for high-efficiency conversion during active mode, and a linear voltage regulator 26b for ultra-low quiescent current operation during sleep mode. If one of the converters 26 is in use, it would be typical to power down the other unused converter 26 to save energy. In this embodiment, the buck converter 26a will generally be enabled when the system 12 is in active mode with loads on the order of 100 μA to 5 mA. In such a mode, buck converter 26a is capable of delivering power at a variety of voltages (including sub-threshold and near-threshold voltages) with power efficiencies exceeding 90%. However, load currents in a sub-threshold or near-threshold circuit may fall below 100 nA in a sleep mode, and the power efficiency of buck converter 26a could easily fall below 5%. In this sleep mode, it may be desirable to switch over to a second converter that offers better power efficiency. For example, linear voltage regulator 26b can be easily adapted to operate with quiescent current on the order of 1 nA yet be capable of delivering much great power efficiency with load currents on the order of 100 nA. Typically, such an embodiment of linear voltage regulator 26b will be incapable of sourcing active load currents in the range of 100 μA to 5 mA, but automatic switchover to the buck converter 26a in active mode solves this problem.

Optimizing the power consumption of an MCU-based system requires some mechanism to measure energy usage over time and during various types of operations, which allows system designers to develop software adapted dynamically to reduce power. Many MCUs include a number of standard counters, e.g., in the Peripherals facility (see, FIG. 2), which may be used in a variety of ways to enable power measurement without adding hardware cost.

Traditional low power systems-on-a-chip ("SOC") implementations typically include an integrated power supply unit ("PSU") to supply power to the MCU chip and to the system as a whole. Linear voltage regulators are provided in the PSU for low current consumption modes where they are extremely efficient. The PSU typically contains one or more buck converters to provide the higher currents necessary when the system is in normal operation with main loads turned on. Buck converters are typically more efficient than linear voltage regulators in these high current load cases. In general, buck converters operate by injecting current from a high-voltage source rail into a lower-voltage drive rail which supplies the system with its operating current. In either form of power supply, linear regulator or buck converter, it is difficult (if not impossible) to directly quantize the delivered output current using circuits amenable to integration into a single IC. Accordingly, indirect monitoring approaches are usually employed. For example, one possible approach would be to develop, either empirically or using a simulation facility, an estimate of the power consumption of a particular SOC facility each time it is engaged, then counting the number of times so engaged within a selected monitoring period; total consumed power can thus be estimated by simply multiplying the heuristic power estimate per engagement by the number of engagements. By way of example, the facility of interest might be an arithmetic and logic unit ("ALU") within the CPU which is adapted to execute each of a plurality of pre-defined program instructions as integral units of work. Prior art power management units ("PMUs") of this type have been proposed to facilitate chip- or module-level thermal management. However, such approaches are relatively gross and provide, at best, very coarse-grained energy consumption measurements, which are of little utility in managing power consumption is near real-time.

What is needed is a method and apparatus adapted to quantize energy being delivered by the PSU in relatively small, integral units. Monitoring this fine-grained quantized data stream over time will better facilitate energy management in near real-time.

BRIEF SUMMARY OF THE INVENTION

In accordance with some embodiments, an apparatus for measuring energy consumption by a load comprising a pulse generating apparatus adapted to develop a plurality of pulses, each of the plurality of pulses delivering a fixed amount of charge to the load, a counter adapted to receive the plurality of the pulses, and accumulate an accumulated count of the plurality of the pulses, and a processor adapted to read the accumulated count of the plurality of pulses, and develop a measure of energy delivered to the load as a function of the fixed amount of charge and the accumulated count of the plurality of pulses.

BRIEF DESCRIPTION OF THE SEVERAL VIEWS OF THE DRAWINGS

The several embodiments may be more fully understood by a description of certain preferred embodiments in conjunction with the attached drawings in which.

Figure 1:
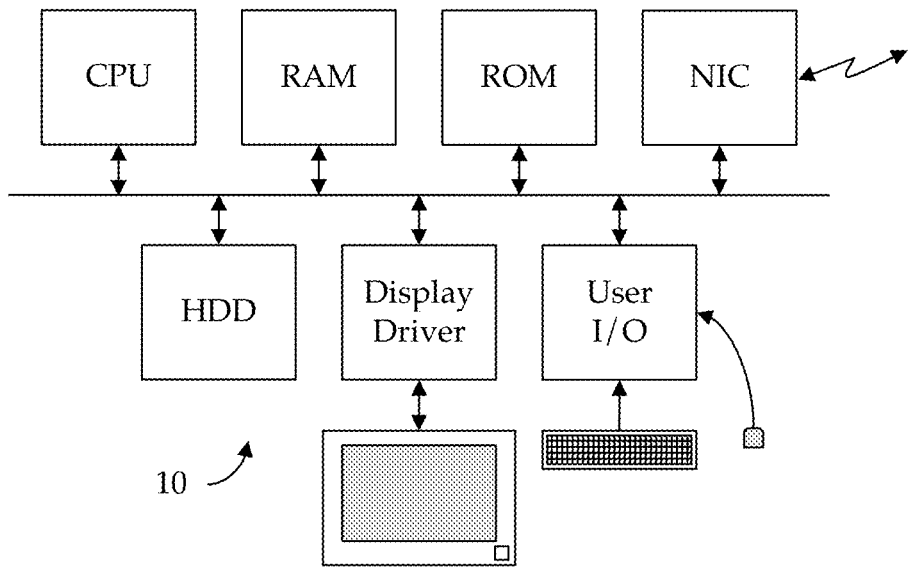
FIG. 1 illustrates, in block diagram form, a general purpose computer system adapted to instantiate any of the several embodiments.

In the drawings, similar elements will be similarly numbered whenever possible. However, this practice is simply for convenience of reference and to avoid unnecessary proliferation of numbers, and is not intended to imply or suggest that identity is required in either function or structure in the several embodiments.

DETAILED DESCRIPTION OF THE INVENTION

Figure 3:
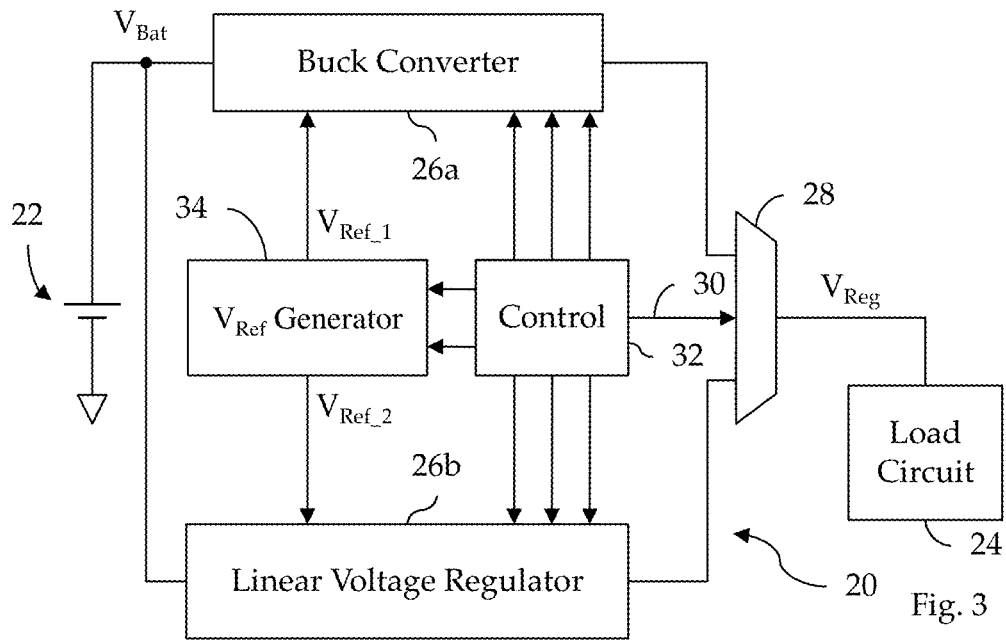
FIG. 3 illustrates, in block schematic form, one embodiment of an adaptive voltage converter.
Figure 4:
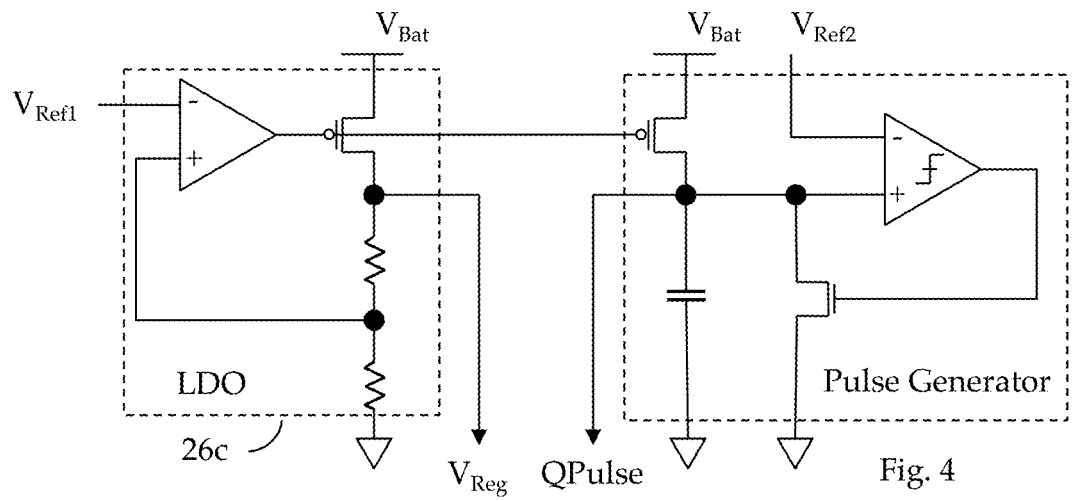
FIG. 4 illustrates, in schematic form, one embodiment of a linear voltage converter suitable for practicing the present invention.

In the Related Application 1, an adaptive voltage converter 20 was disclosed comprising a buck converter 26a and a linear voltage regulator 26b (see, FIG. 3). In accordance with one embodiment of the present invention, buck converter 26a is adapted to provide a pulse, QPulse, each time a unit of charge is delivered to the load circuits 24, where a pulse is typically delineated either by its leading or trailing edge. Preferably, each pulse of the QPulse signal corresponds to the transfer of a fixed amount of charge from buck converter 26a to the load circuits 24. One known buck converter can be seen in FIG. 1 (Prior Art) of U.S. Pat. No. 5,006,782, expressly incorporated herein by reference; in this prior art circuit, the output of duty cycle control 18 coupled to the gate of switching transistor 12 would be suitable for use in the present method as the QPulse signal. Shown in FIG. 4 is an embodiment of a low-drop-out ("LDO") linear regulator 26c which can be combined with a pulse generator adapted to develop a QPulse signal indicative of each unit of charge delivered to the load circuits 24.

Figure 2:
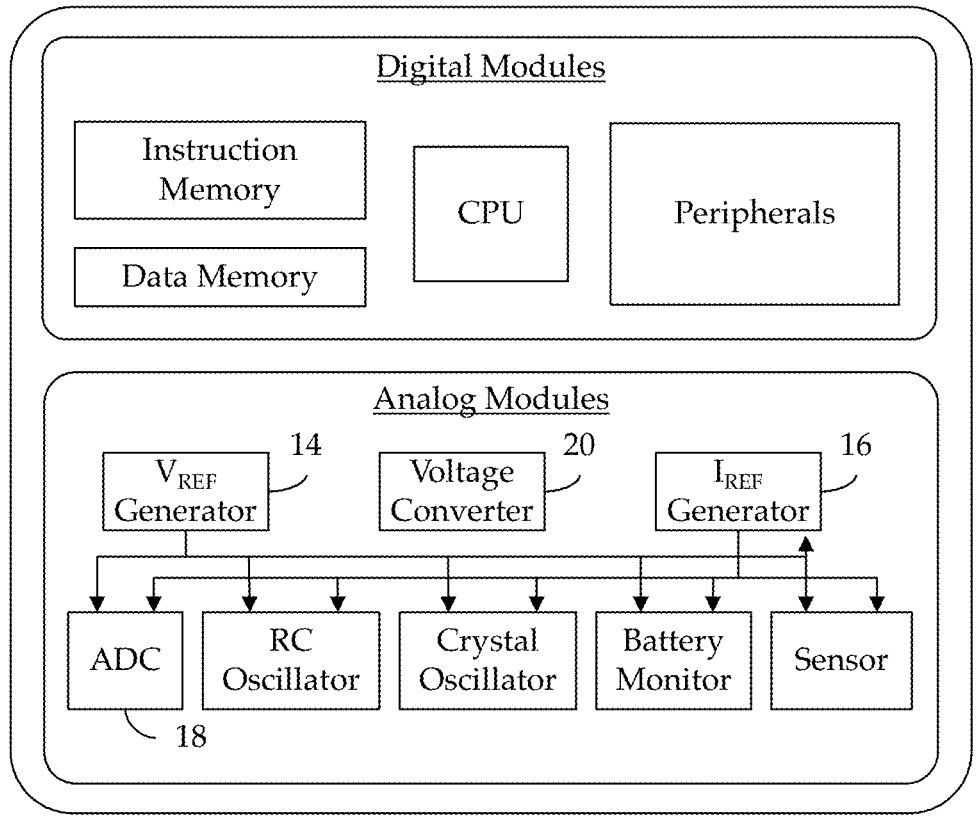
FIG. 2 illustrates, in block diagram form, a typical integrated system adapted to practice any of the several embodiments.
Figure 5:
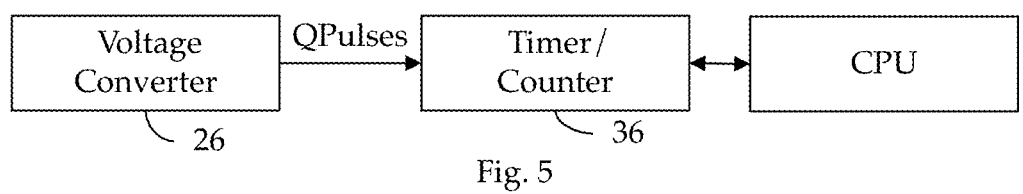
FIG. 5 illustrates, in block schematic form, one embodiment of an energy monitor in accordance with the present invention.

In one embodiment, illustrated generally in FIG. 5, the QPulses are accumulated or integrated in a counter 36 to get a measure of the energy delivered to the operating loads over an interval of time. For example, in an SOC having in the Peripherals facility (see, FIG. 2), any available, conventional timer/counter may be used to count QPulses as they arrive. At the desired start time for the integration, the CPU clears counter 36 and connects it to the QPulse pulse signal. At the desired stop time, the CPU reads the QPulse count stored in counter 36, and either clears or stops counter 36. As will be clear, the QPulse count multiplied by the charge-per-quantum is proportional to the energy consumed from the buck converter 26a by the system load circuits 24. Determination of the desired start and stop times is typically handled by connecting a clock signal to a counter in addition to the one used to accumulate QPulses. The clock source may be generated either on chip or off-chip.

Figure 6:
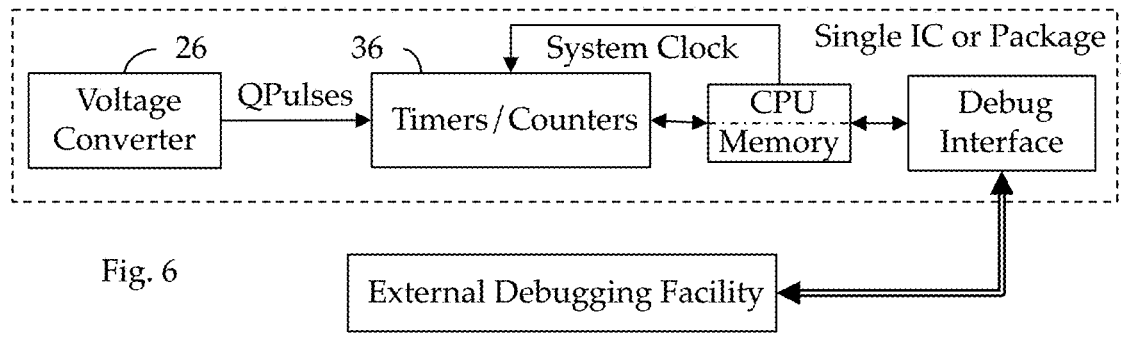
FIG. 6 illustrates, in block diagram form, one embodiment of an energy monitoring system in accordance with the present invention.

As shown in FIG. 6, the energy monitoring facility integrated within a single IC (or package of ICs), may be adapted to use a debug interface to coordinate collection and analysis of the energy consumption information by an external debug facility. In general, QPulse counts may be sent across the debug interface in real time or can be collected in an on-chip memory and then sent out periodically over the debug interface, which may be a traditional debug interface like JTAG or a general purpose interface like SPI or even a radio. In one embodiment, since the counter 36 is readable by the CPU, system software may be adapted to add trace hooks to collect the QPulse counts for near real-time energy consumption analysis. Generally speaking, a software trace hook is a store instruction that is targeted at an instrumentation register that causes the event of writing to a trace hook register, and the value so written to be recorded somewhere on a time-stamped media. An example of such debug hardware is the Instrumentation Trace Macro ("ITM") developed by ARM Holdings for use under license with their processor IP.

Figure 7:
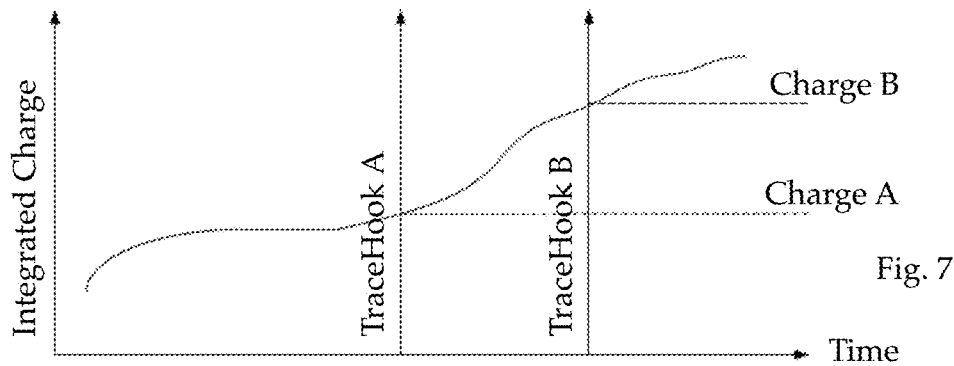
FIG. 7 illustrates, in wave diagram form, one example of the integration of QPulses by the energy monitor of FIG. 5.

In one embodiment, two of the available ITM registers (not shown) can be used such that a unique code location marker is written to one ITM register and the accumulated charge value is written to another. In general, the integrated QPulse counts reported with each trace hook represent the accumulated charge (i.e., current) up to the trace hook sample time. The result is a series of monotonically increasing step functions. FIG. 7 shows an example of trace hooks firing against a backdrop of the QPulse charge accumulation profile as it would be measured by an external device such as a current mode scope probe. Since the integration or accumulation is accretive then at any moment the QPulse count in counter 36 is proportional to the accumulated charge delivered to the load circuits 24 from the time counter 36 was cleared until the time at which it is read. By allowing counter 36 to continue accumulating QPulses after each reading, a profile of near real-time energy consumption over time can be developed.

In one embodiment, it is possible to instrument the long execution of an application in this way so as to develop a measure of the total energy consumed for a mode of the application. By adding more frequent trace hooks, the energy consumption profile may be revealed at various selected points in the software for that application. In one embodiment, this method may be adapted to search for the hot spots in the software program, i.e., the places or modes where significant energy is being consumed. Adding more trace hooks may reveal opportunities for energy optimization that might exist within a program.

It will be noted that no significant additional hardware was required to enable this data capture and software tuning algorithm other than providing a path from the Qpulse source in the buck converter 26a to the input of an otherwise conventional timer counter 36 in an existing, on-chip peripheral facility.

In general, it may be useful to transform the QPulse count before storing it in memory or transmitting it off chip. The on-chip CPU may be used to compute a value or set of values as a function of the QPulse counts. For example, the present invention assumes stable input and output voltages of the voltage converter 20. Any error arising from this assumption may be mediated by using an ADC 18 (see, FIG. 2) periodically to determine the actual input and/or the output voltages of the voltage converter 20. These measurements can then be used to translate charge to energy (energy=charge*voltage) in the energy monitoring algorithm and transmitted off chip for use by an external debug facility.

Although the present invention has been described in the context of an energy measurement system based on a buck converter, this methodology also works if the buck converter is replaced by any other type of voltage converter that can be modified to produce a digital pulse upon sourcing a fixed amount of charge. For example, in the embodiment shown in FIG. 4, a linear voltage regulator can supply such a pulse by mirroring its output current onto a capacitor. Every time a comparator detects that the capacitor has charged up to a pre-determined level, the capacitor can be discharged through a discharge transistor. The resulting output of the comparator comprises a digital pulse train that is substantially analogous to the Qpulse output of buck converter 26a.

Figure 8:
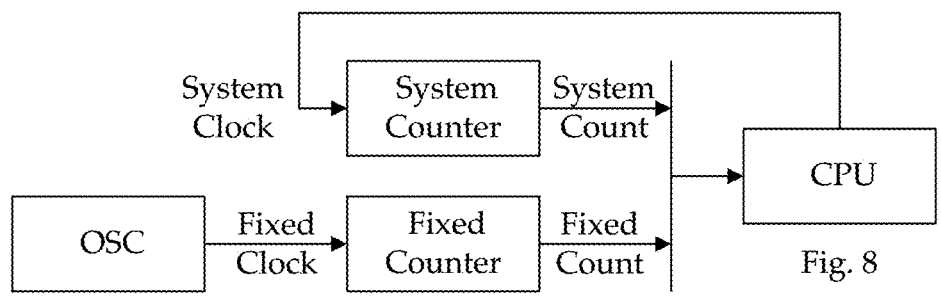
FIG. 8 illustrates, in block schematic form, one embodiment of an activity monitor in accordance with the present invention.
Figure 9:
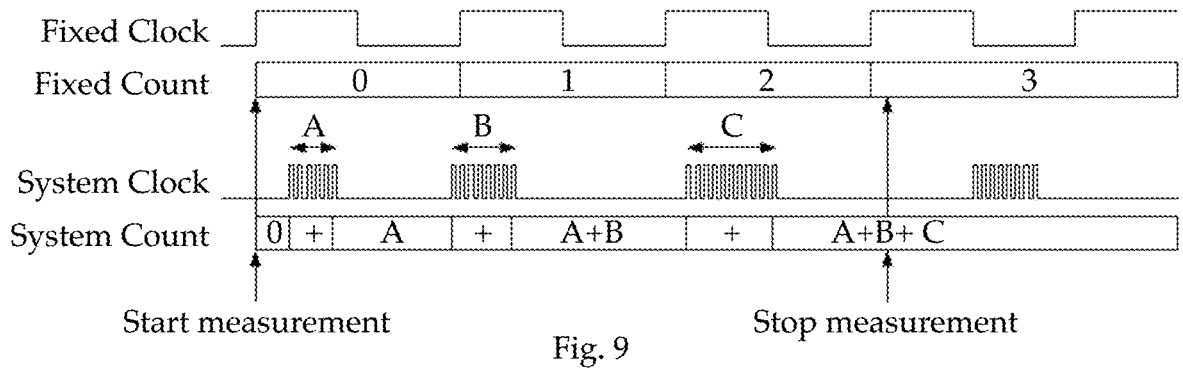
FIG. 9 illustrates, in time diagram form, operation of the activity monitor of FIG. 8 during one exemplary period of operation.

A major goal of software energy optimization is to keep the processor inactive as much as possible. A counter can easily implement the measurement of active time (the activity measurement) simply by providing the system clock as a counting input, while using another counter to measure real time. Counting the number of system clocks which occur in a particular time period, divided by the system clock frequency, produces a very accurate measurement of the percentage of time the processor is active. This information can then be used to optimize the percentage of time the software is able to keep the system in an inactive mode. FIG. 8 illustrates one possible hardware embodiment of the process. A Fixed Clock, which runs continuously and is typically required in order to maintain real time, drives a Fixed Counter which develops the Fixed Count. The System Clock, which runs only when the system processor is active, drives a System Counter which develops the System Count. In one embodiment, illustrated by way of example in FIG. 9, the activity measurement process is initiated by clearing both counters to zero. The Fixed Count increments by 1 on each Fixed Clock period, so that it represents the actual elapsed time. The System Count increments only when the System Clock is running, so that after the first burst of A System Clock cycles the System Count is A. After the second burst of B System Clocks the System Count is A+B, and so on for each burst of activity. At some selected point, the activity measurement process is stopped, and the values in the Fixed Count and System Count counters are read. Since the frequency of the Fixed Clock, $f_{FIX}$, and the frequency of the System Clock, $f_{SYS}$, are precisely known, then, if the Fixed Count value at the end of the activity measurement period is FIX and the System Count value is SYS, the percentage of time that the processor was active, ACTPCT, is given by:

$$ACTPCT = (SYS/f_{SYS})/(FIX/f_{FIX}) \qquad [Eq.\ 1]$$

As an example, assume the Fixed Clock is derived from a standard 32,768 Hz crystal oscillator and the System Clock is 24 MHz. Therefore, the period of each Fixed Clock cycle is 1/32768 or 30.518 us. After a period of, say, 100 Fixed Clock cycles, the value of FIX will be 100, i.e., 3.052 ms. If the System Clock runs for 100,000 cycles 50 times during this period, the value of SYS will be 5,000,000. Thus, in this example, the period of each System Clock cycle is 1/24,000,000 or 41.66 ns, where 5,000,000 cycles is 208.3 us. Therefore, it is now possible to calculate that the processor was active for 208.3 us out of 3.052 ms, or 6.825% of the time.

In some embodiments the counters, particularly the Fixed Counter, may be required to count continuously and thus cannot be initialized to zero to restart each activity measurement cycle anew. An alternative approach in such embodiments is to simply read and retain the current value of each continuously running counter, execute the activity measurement cycle and then subtract the initial counter value from the final counter value in each case to get the relative count developed during the period.

Exactly as in the case of the energy consumption measurement, the activity measurement may be captured by trace hooks which cause the active percentage to be recorded on the time stamped media. The combination of the energy measurement and the activity measurement may give a clearer near real-time picture of energy usage in the system, and enable better optimization in software. For example, if the energy measurement indicates significant energy consumption during periods when the processor is inactive, it can be assumed that some other SOC device is responsible, and, once identified, appropriate measures may be taken to optimize that usage.

Counters may also be used in a similar way to measure the activity of many other components of the MCU (e.g., ADC, cache, serial interface, DAC, etc.). One example would be to measure accesses from memory when functioning as a backing store of a cache. In one embodiment, a pulse is generated each time the processor reads data from the cache, and a pulse is also generated each time the processor reads from a Flash memory configured as the backing store of the cache. The respective counts of these pulses can be used to precisely determine what percentage of cache accesses result in a Flash access (i.e., a cache miss). In other words, the ratio of cache reads versus cache misses provides an accurate measurement of the cache hit ratio. Comparing two activities in this way can often provide significant data which may be useful in optimizing the energy usage and performance of a system.

Although described in the context of particular embodiments, one of ordinary skill in this art will readily realize that many modifications may be made in such embodiments to adapt either to specific implementations.

Thus it is apparent that an improved method and apparatus for measuring energy consumption in near real-time has been disclosed. Further, this method and apparatus provides performance generally superior to the best prior art techniques.

What is claimed is:

1. An apparatus for measuring energy consumption by a load comprising:
   a pulse generating apparatus adapted to:
      develop a plurality of pulses, each of said plurality of pulses delivering a fixed amount of charge to said load;
   a counter adapted to:
      receive said plurality of said pulses; and
      accumulate an accumulated count of said plurality of said pulses; and
   a processor adapted to:
      read said accumulated count of said plurality of pulses, and
      develop a measure of energy delivered to said load as a function of said fixed amount of charge and said accumulated count of said plurality of pulses.

2. The apparatus of claim 1 wherein said processor is further characterized as collecting a plurality of said measures developed over a selected period of time; and analyzing said collected measures to determine a pattern of energy consumption by said load over said selected period of time.

3. The apparatus of claim 1 wherein said pulse generating apparatus is further characterized as a buck converter.

4. The apparatus of claim 1 wherein said pulse generating apparatus is further characterized as comprising a voltage converter and a pulse generator.

5. An electronic system comprising an apparatus for measuring energy consumption according to claim 1.

6. An apparatus for measuring energy consumption by a load comprising:
   a buck converter apparatus adapted to:
      develop a plurality of pulses;
         each of said plurality of pulses delivering a fixed amount of charge to said load; and
         said load being further characterized as drawing a load current greater than or equal to 100 nanoamperes;
   a counter adapted to:
      receive said plurality of said pulses; and
      accumulate an accumulated count of said plurality of said pulses; and
   a processor adapted to:
      read said accumulated count of said plurality of pulses, and
      develop a measure of energy delivered to said load as a function of said fixed amount of charge and said accumulated count of said plurality of pulses.

7. The apparatus of claim 6 wherein said processor is further characterized as collecting a plurality of said measures developed over a selected period of time; and analyzing said collected measures to determine a pattern of energy consumption by said load over said selected period of time.

8. An electronic system comprising an apparatus for measuring energy consumption according to claim 6.

* * * * *